United States Patent
Hainz et al.

(10) Patent No.: US 12,326,351 B2
(45) Date of Patent: Jun. 10, 2025

(54) LINEAR TUNNEL MAGNETORESISTIVE SENSOR INCLUDING AN INTEGRATED BACK-BIAS MAGNET

(71) Applicant: Infineon Technologies AG, Neubiberg (DE)

(72) Inventors: Simon Hainz, Villach (AT); Matthias Pohl, Hannover (DE)

(73) Assignee: Infineon Technologies AG, Neubiberg (DE)

( * ) Notice: Subject to any disclaimer, the term of this patent is extended or adjusted under 35 U.S.C. 154(b) by 184 days.

(21) Appl. No.: 17/938,873

(22) Filed: Oct. 7, 2022

(65) Prior Publication Data

US 2024/0118111 A1   Apr. 11, 2024

(51) Int. Cl.
  *G01D 5/16* (2006.01)
  *G01R 33/09* (2006.01)

(52) U.S. Cl.
  CPC .............. *G01D 5/16* (2013.01); *G01R 33/098* (2013.01)

(58) Field of Classification Search
  CPC ............ G01D 5/12–2525; G01R 33/06; G01R 33/09–098
  See application file for complete search history.

(56) References Cited

U.S. PATENT DOCUMENTS

| | | | |
|---|---|---|---|
| 2009/0146647 A1* | 6/2009 | Ausserlechner | G01D 5/145 324/207.21 |
| 2014/0028307 A1* | 1/2014 | Ausserlechner | G01R 33/096 324/252 |
| 2014/0084906 A1* | 3/2014 | Ruigrok | G01R 33/091 324/207.21 |
| 2014/0232379 A1* | 8/2014 | Nazarian | G01D 5/147 324/207.21 |
| 2016/0169707 A1 | 6/2016 | Hirota et al. | |
| 2017/0234702 A1* | 8/2017 | Tima | G01D 5/2013 324/207.25 |
| 2018/0128648 A1* | 5/2018 | Schmitt | G01R 33/096 |
| 2018/0335294 A1* | 11/2018 | Ausserlechner | G01R 33/022 |
| 2018/0335441 A1* | 11/2018 | Hammerschmidt | G01P 3/488 |
| 2018/0335486 A1 | 11/2018 | Lassalle-Balier et al. | |
| 2019/0234767 A1* | 8/2019 | Binder | G01D 5/2216 |
| 2020/0105125 A1 | 4/2020 | Haas et al. | |
| 2021/0063501 A1 | 3/2021 | Lassalle-Balier et al. | |
| 2021/0293911 A1* | 9/2021 | Lassalle-Balier | G01R 33/098 |

\* cited by examiner

*Primary Examiner* — Huy Q Phan
*Assistant Examiner* — David B Frederiksen
(74) *Attorney, Agent, or Firm* — Harrity & Harrity, LLP (57) ABSTRACT

A sensor module may include a back-bias magnet with a magnetization in a first direction. The sensor module may include a sensor chip including a first set of tunnel magnetoresistive (TMR) sensing elements. The sensor chip may be configured to determine a characteristic of a first magnetic field component using the first set of TMR sensing elements, and to generate a sensor signal based at least in part on the characteristic of the first magnetic field component. A value of the sensor signal may correspond to a linear position of a ferromagnetic object.

20 Claims, 5 Drawing Sheets

LINEAR TUNNEL MAGNETORESISTIVE SENSOR INCLUDING AN INTEGRATED BACK-BIAS MAGNET

BACKGROUND

A magnetic linear position sensor may be used for angular position and linear position detection of an object in, for example, an automotive application or an industrial application. In general, a magnetic linear position sensor can be used to detect a position of a rotating or linearly moving object. A position measurement provided by a magnetic linear position sensor can be an absolute position measurement (e.g., an output that corresponds to the absolute position of the object) or an incremental position measurement (e.g., an output that corresponds to a velocity and direction of movement of the object), depending on a design of the magnetic linear position sensor.

SUMMARY

In some implementations, a sensor module includes a back-bias magnet with a magnetization in a first direction; a sensor chip including a first set of tunnel magnetoresistive (TMR) sensing elements, wherein the sensor chip is configured to: determine a characteristic of a first magnetic field component using the first set of TMR sensing elements; and generate a sensor signal based at least in part on the characteristic of the first magnetic field component, wherein a value of the sensor signal corresponds to a linear position of a ferromagnetic object.

In some implementations, a method includes determining, by a sensor chip, a characteristic of a first magnetic field component using a first set of TMR sensing elements; and generating, by the sensor chip, a sensor signal based at least in part on the characteristic of the first magnetic field component, wherein a value of the sensor signal corresponds to a linear position of a ferromagnetic object.

In some implementations, a sensor chip includes a first set of TMR sensing elements that is sensitive in a first direction; a second set of TMR sensing elements that is sensitive in a second direction that is perpendicular to the first direction; and one or more components to: determine a characteristic of a first magnetic field component using the first set of TMR sensing elements; determine a characteristic of a second magnetic field component using the second set of TMR sensing elements; and generate a sensor signal based on the characteristic of the first magnetic field component and the second magnetic field component, wherein a value of the sensor signal corresponds to a linear position of a ferromagnetic object.

DETAILED DESCRIPTION

The following detailed description of example implementations refers to the accompanying drawings. The same reference numbers in different drawings may identify the same or similar elements.

A magnetic linear position sensor system (herein referred to as a linear sensor system) may be used to measure a position or linear movement an object. In operation, the linear sensor system senses a magnetic field in order to enable the linear position or the direction of linear movement to be determined. For example, in an automotive application, a ferromagnetic object may be used in combination with a magnet and a set of sensing elements on one or more sensor chips. Here, a level of a sensor signal provided by the linear sensor system indicates the linear position or the direction of movement of the ferromagnetic object (or the linear position or the direction of movement of the linear sensor system itself). The sensor signal can then be used by a control device (e.g., a microcontroller (μC), an electronic control unit (ECU), and/or the like) in association with controlling a system or sub-system of an automobile (e.g., a braking system, a steering system, a clutch system, or the like).

Figure 1A:
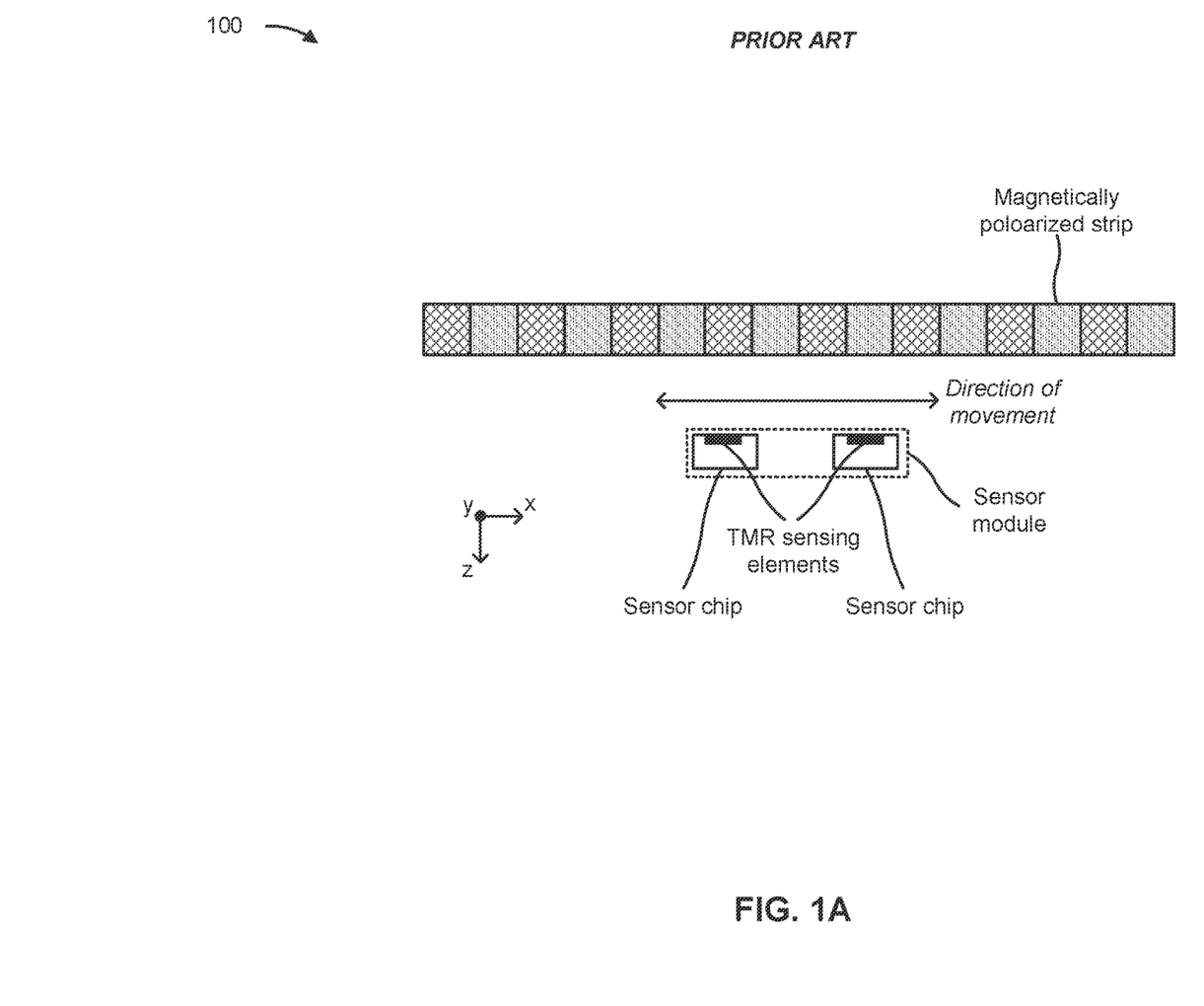
FIGS. 1A and 1B are diagrams of prior art linear sensor systems.

FIG. 1A is a diagram of a prior art linear sensor system 100. As shown in FIG. 1A, prior art linear sensor system 100 includes a magnetically polarized strip (shown in a side view in FIG. 1A) that moves along an axis (e.g., a horizontal axis in FIG. 1A). As further shown, the prior art linear sensor system 100 includes a sensor module comprising two sensor chips, each of which includes a set of tunnel magnetoresistive (TMR) sensing elements. In the prior art linear sensor system 100, the sets of TMR sensing elements are typically sensitive in a direction that is parallel to the direction of movement (e.g., an x-direction). The prior art linear sensor system 100 can be thought of as including two separate one-dimensional (1D) TMR sensors that are separated by some distance. In operation, as the magnetically polarized strip moves along the x-direction (i.e., along the axis of sensitivity of the sensing elements of the two 1D TMR sensors), the two 1D TMR sensors can output waveforms that are 90 degrees out-of-phase with respect to one another. A change in the linear position of the magnetically polarized strip can then be determined based on the output voltages of the sensor signals, previously measured output voltages of the sensor signals, and using the arctangent function.

However, the prior art linear sensor system 100 has a number of drawbacks. For example, the prior art linear sensor system 100 can provide a relative position measurement (e.g., a change in position with respect to a previously measured position), but cannot provide an absolute position measurement. Further, the prior art linear sensor system 100 cannot provide a position measurement at power-on (e.g., since multiple measurements are needed). Additionally, the prior art linear sensor system 100 may have a relatively large package size (e.g., due to the magnetically polarized strip) and, therefore, the prior art linear sensor system 100 may have a high cost and/or may not be unusable in an application where physical space is limited.

Figure 1B:
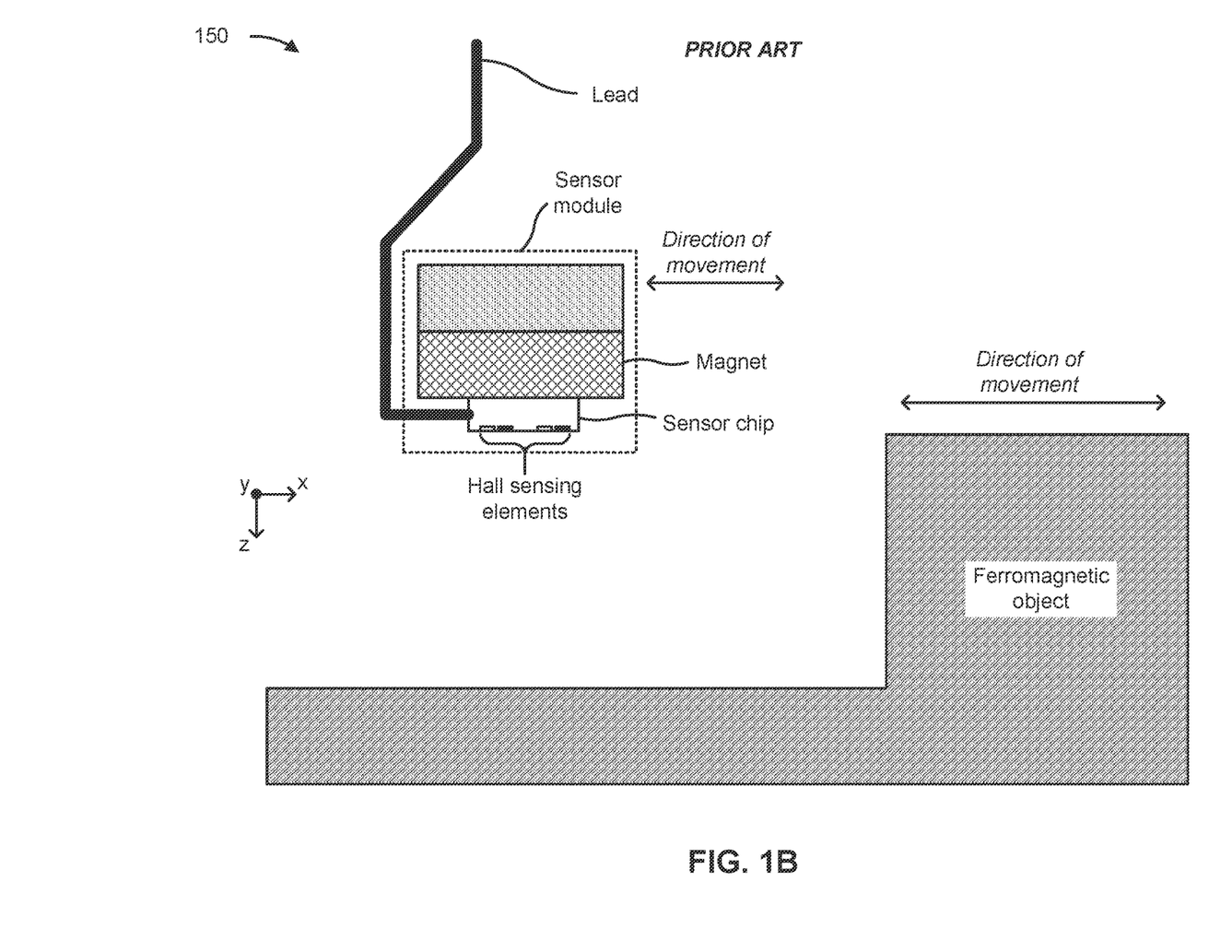

FIG. 1B is a diagram of a prior art linear sensor system 150. As shown in FIG. 1B, prior art linear sensor system 150 includes a ferromagnetic object (shown in a side view in FIG. 1B) that moves along an axis (e.g., a horizontal axis as indicated in FIG. 1B). As further shown, the prior art linear sensor system 150 includes a sensor module comprising a sensor chip including a set Hall-based sensing elements, a magnet (e.g., on which the sensor chip is mounted), and a lead (e.g., connecting the sensor chip to a control device (not shown)) via which the sensor chip can provide a sensor signal.

As shown in FIG. 1B, in the prior art linear sensor system 150, the sensor chip is arranged such that a surface on which the sensing elements are arranged faces the ferromagnetic object. In the prior art linear sensor system 150, the set of Hall-based sensing elements includes two Hall-based sensing elements that are sensitive in a direction that is parallel to the direction of movement (e.g., an x-direction) and two Hall-based sensing elements that are sensitive in a direction that is perpendicular to the direction of movement (e.g., a z-direction). The prior art linear sensor system 150 can be thought of as a two-dimensional (2D) linear Hall sensor that senses an x-component of the magnetic field and a z-component of the magnetic field. The magnet is magnetized in the direction that is perpendicular to the direction of linear movement (e.g., the magnet is an axial magnet in FIG. 1). In operation, as the ferromagnetic object moves along the x-direction, the ferromagnetic object distorts the magnetic field produced by the magnet and the 2D linear Hall sensor can output waveforms corresponding to the strength of the x-component of the magnetic field and the strength of the z-component of the magnetic field (e.g., the components of the magnetic field in the directions of sensitivity of the Hall-based sensing elements). The linear position of the ferromagnetic object can be determined based on the waveforms by application of the arctangent function. Notably, the 2D linear Hall sensor can provide robustness to stray fields through the principle of differential sensing.

However, the prior art linear sensor system 150 has a number of drawbacks. For example, the bent lead and a size of the magnet in the prior art linear sensor system 150 increase a required overall size and cost of the sensor module (e.g., since a size of the sensor module needs to be sufficient to house the magnet and the lead), meaning that the prior art linear sensor system 150 may be cost prohibitive and/or may be usable in an application where physical space is limited. Additionally, Hall-based sensing elements suffer from low accuracy, particularly in an in-plane direction (e.g., the x-direction in the prior art linear sensor system 150). Therefore, a measurement provided by the prior art linear sensor system 150 may not be sufficiently reliable. Further, the prior art linear sensor system 150 has a limited capability to provide a position measurement at power-on.

Some implementations described herein provide an improved linear TMR sensor system including an integrated back-bias magnet. In some implementations, the improved linear TMR sensor system includes a sensor module comprising a back-bias magnet with a magnetization in a first direction, and a sensor chip including a first set of TMR sensing elements. Here, the sensor chip may be configured to determine a characteristic of a first magnetic field component using the first set of TMR sensing elements, and to generate a sensor signal based at least in part on the characteristic of the first magnetic field component, where a value of the sensor signal corresponds to a linear position of a ferromagnetic object.

In some implementations, the improved linear TMR sensor system described herein utilizes a smaller and lower cost magnet and, therefore, has a reduced package size (e.g., as compared to the prior art linear sensor system 100 or the prior art linear sensor system 150). As a result, the improved linear TMR sensor system may have a lower cost and/or may be usable in an application where physical space is limited. Further, the improved linear TMR sensor system does not require bending of leads, thereby reducing cost and complexity and improving manufacturability. Additionally, TMR-based sensing elements have a high accuracy, even in in-plane directions and, therefore, a measurement provided by the improved linear TMR sensor system may have increased reliability. Further, the improved linear TMR sensor has a capability to provide a position measurement at power-on, and can be configured to provide robustness to stray fields through the principle of differential sensing. Additional details of the improved linear TMR sensor system are provided below.

Figure 2:
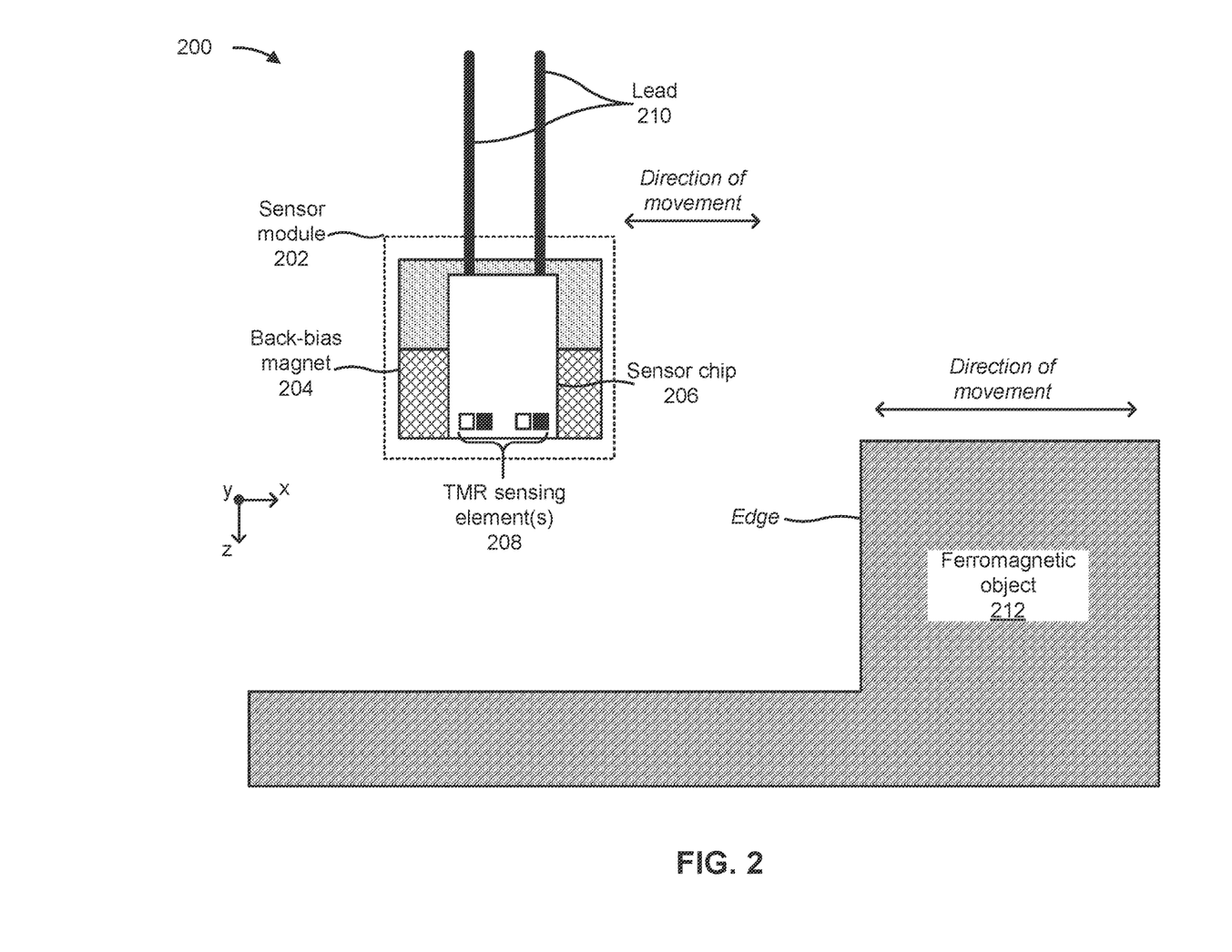
FIG. 2 is a diagram of a linear tunnel magnetoresistive (TMR) sensor system including an integrated back-based magnet.

FIG. 2 is a diagram of an improved linear TMR sensor system 200 including an integrated back-based magnet. As shown in FIG. 2, the linear TMR sensor system 200 may include a sensor module 202 comprising a back-bias magnet 204 and a sensor chip 206 with one or more sets of TMR sensing elements 208. As further shown, the linear TMR sensor system 200 may include one or more leads 210 (e.g., connecting the sensor chip 206 to a control device (not shown)) and a ferromagnetic object 212.

The sensor module 202 includes a component that houses back-bias magnet 204, sensor chip 206, and (at least partially) the one or more leads 210. In some implementations, the sensor module 202 has a reduced size (e.g., as compared to the sensor module of the prior art linear sensor systems described above). For example, since (1) the back-bias magnet 204 has a relatively small dimension in the y-direction (e.g., as compared to the magnet in prior art linear sensor system 100), (2) a surface of the sensor chip 206 is aligned substantially along a module axis of symmetry (e.g., rather than perpendicular to the module axis of symmetry), and (3) no extra space is required for bends of the one or more leads 210, the sensor module 202 may be made smaller in size than the sensor module of, for example, the prior art linear sensor system 150. Thus, the sensor module 202 may have a comparatively lower cost, may be manufactured at a lower cost, and/or may require less physical space than the sensor module of the prior art linear sensor system 150.

The back-bias magnet 204 includes a magnet that is configured to bias the TMR sensing elements 208 of sensor chip 206. In some implementations, the back-bias magnet 204 comprises a first half forming a north pole (N) and a second half forming a south pole (S), so that back-bias magnet 204 comprises one pole pair. For example, the back-bias magnet 204 may include a magnet with a north pole on a first half of back-bias magnet 204 that is stacked (e.g., along the z-direction) on a south pole on a second half of the back-bias magnet 204. Additionally, or alternatively, the back-bias magnet 204 may include a dipole magnet (e.g., a dipole bar magnet, a circular dipole magnet, an elliptical dipole magnet, a cylindrical magnet, etc.), and/or the like. Notably, while the back-bias magnet 204 is shown as having a rectangular shape in FIG. 2, the back-bias magnet 204 may have another shape, such as a square shape, a circular shape, an elliptical shape, a triangular shape, a ring shape, and/or the like. In some implementations, the back-bias magnet 204 may be relatively simple and/or low-cost to manufacture and/or design (e.g., as compared to a magnet composed of a non-ferrous material, a magnet with a pyramid cavity, a magnet with a tilted magnetization, a specially designed magnet, and/or the like), thereby reducing an overall cost and/or complexity of the linear TMR sensor system 200.

In some implementations, the back-bias magnet 204 is magnetized in a direction that is parallel to a surface of the sensor chip 206 on which the set of TMR sensing elements 208 are arranged. For example, in the linear TMR sensor system 200, the back-bias magnet 204 may be magnetized along a direction that is substantially parallel to the z-direction. In some implementations, back-bias magnet 204 may be (e.g., mechanically) connected to the sensor chip 206 such that the back-bias magnet 204 is arranged symmetrically with respect to a particular subset of the to the set of TMR sensing elements 208. For example, the back-bias magnet 204 may be arranged such that a characteristic (e.g., a strength) of a z-component of a bias magnetic field produced by the back-bias magnet 204 is substantially the same at each TMR sensing element 208 that is sensitive in the z-direction.

The sensor chip 206 includes a component (e.g., an integrated circuit) that provides sensing functionality as described herein. In some implementations, the sensor chip 206 includes the set of TMR sensing elements 208, each of which is configured to sense an in-plane component (e.g., a component that is substantially parallel to a plane defined by the surface of the sensor chip 206, such as a z-component or an x-component) of a magnetic field (e.g., a magnetic field produced by back-bias magnet 204) present at the TMR sensing element 208. Additional details regarding the set of TMR sensing elements 208 and other components of the sensor chip 206 are described below with respect to FIG. 3.

In some implementations, the sensor chip 206 includes one or more sets of TMR sensing elements 208. For example, in some implementations, the sensor chip 206 includes a single set of TMR sensing elements 208. In some implementations, each TMR sensing element 208 in the single set of TMR sensing elements 208 may be sensitive in a direction that is parallel to the direction of magnetization of the back-bias magnet 204 (e.g., with reference to FIG. 2, each of the TMR sensing elements 208 in the single set of TMR sensing elements 208 may be sensitive in the z-direction). Alternatively, in some implementations, each TMR sensing element 208 in the single set of TMR sensing elements 208 may be sensitive in a direction that is perpendicular to the direction of magnetization of the back-bias magnet 204 (e.g., with reference to FIG. 2, each of the TMR sensing elements 208 in the single set of TMR sensing elements 208 may be sensitive in the x-direction). Thus, in some implementations, the linear TMR sensor system 200 may comprise a 1D linear TMR sensor.

As another example, in some implementations, the sensor chip 206 includes a first set of TMR sensing elements 208 and a second set of TMR sensing elements 208. Here, each TMR sensing element 208 in the first set of TMR sensing elements 208 may be sensitive in the direction that is parallel to the direction of magnetization of the back-bias magnet 204 (e.g., the z-direction) and each TMR sensing element 208 in the second set of TMR sensing elements 208 may be sensitive in the direction that is perpendicular to the direction of magnetization of the back-bias magnet 204 (e.g., the x-direction). Thus, in some implementations, the linear TMR sensor system 200 may comprise a 2D linear TMR sensor.

In some implementations, the set of TMR sensing elements 208 includes at least two TMR sensing elements 208 that provide differential sensing of the characteristic of a magnetic field component. For example, with reference to FIG. 2, the set of TMR sensing elements 208 may in some implementations include two TMR sensing elements 208 that provide differential sensing of the characteristic of the z-component of the magnetic field component (i.e., the set of TMR sensing elements 208 may include two TMR sensing elements 208 that are sensitive in the z-direction). Additionally, or alternatively, the set of TMR sensing elements 208 may in some implementations include two TMR sensing elements 208 that provide differential sensing of the characteristic of the x-component of the magnetic field component (i.e., the set of TMR sensing elements 208 may include two TMR sensing elements 208 that are sensitive in the x-direction). In some implementations, the sensor chip 206 comprises a mono-cell sensor (e.g., TMR sensing elements 208 in the set of TMR sensing elements 208 are at a single sensor position).

The lead 210 includes a component (e.g., an interconnect, a lead, a lead frame, and/or the like) for connecting the sensor chip 206 to, for example, a control device (e.g., a control device associated with controlling a system based on a linear position of the ferromagnetic object 212). As shown in FIG. 2, due to the arrangement of the sensor chip 206 and the back-bias magnet 204 in the linear TMR sensor system 200, the one or more leads 210 do not need to be bent in order to connect the one or more leads 210 to the control device. As such, a cost and/or a complexity of the linear TMR sensor system 200 may be reduced (e.g., as compared to the prior art linear sensor system 150) since, for example, a processing step for bending the one or more leads 210 is not required. In some implementations, the lack of need for a bend in one or more leads 210 also serves to reduce a physical size of the sensor module 202, as described herein.

The ferromagnetic object 212 includes an object comprising a ferromagnetic material. In some implementations, the ferromagnetic object 212 distorts a magnetic field of the back-bias magnet 204. As the ferromagnetic object 212 and/or the sensor module 202 move along the direction of movement (e.g., the x-direction), the distortion of the magnetic field changes such that the distortion corresponds to the linear position of the ferromagnetic object 212 and/or the linear position of the sensor module 202. In some implementations, the ferromagnetic object 212 may be attached to or coupled to an object for which a linear position and/or a direction of movement is to be measured, such as a brake pedal or a clutch in an automotive application.

In operation in operation of the linear TMR sensor system 200, as the ferromagnetic object 212 (and/or the sensor module 202) moves along the x-direction, the ferromagnetic object 212 distorts the magnetic field produced by the back-bias magnet 204 and the sensor chip 206 (e.g., using the set of TMR sensing elements 208) provides waveforms corresponding to a characteristic of the x-component of the magnetic field and/or a characteristic of the z-component of the magnetic field (e.g., the components of the magnetic field in the directions of sensitivity of TMR sensing elements 208 in the set of TMR sensing elements 208). In some implementations, a characteristic may be a strength of a magnetic field component, a direction of the magnetic field component, or a vector of the magnetic field component. The linear position of the ferromagnetic object 212 and/or the sensor module 202 can be determined based on the waveforms by application of the arctangent function. In some implementations, a value of the sensor signal corresponds to a linear position (e.g., an absolute linear position) of the ferromagnetic object 212. In some implementations, the linear TMR sensor system 200 can determine the absolute linear position of the ferromagnetic object 212 using a single edge (e.g., as indicated in FIG. 2).

In one particular example operation of the linear TMR sensor system 200, the sensor chip 206 includes two TMR sensing elements 208 that are sensitive in the x-direction and two TMR sensing elements 208 that are sensitive in the z-direction. Here, the sensor chip 206 may determine a characteristic (e.g., a strength, a direction, or a vector) of the x-component of the magnetic field using the two TMR sensing elements 208 that are sensitive in the x-direction, and may determine the characteristic of the z-component of the magnetic field using the two TMR sensing elements 208 that are sensitive in the z-direction. The sensor chip 206 then generates a sensor signal based at least in part on the characteristic of the x-component of the magnetic field and the z-component of the magnetic field (e.g., using the arctangent function).

The number and arrangement of elements shown in FIG. 2 are provided as one or more examples. In practice, there may be additional elements, fewer elements, different elements, or differently arranged elements than those shown in FIG. 2. Furthermore, two or more elements shown in FIG. 2 may be implemented within a single element, or a single element shown in FIG. 2 may be implemented as multiple, distributed elements. Additionally, or alternatively, a set of elements (e.g., one or more elements) of the linear TMR sensor system 200 may perform one or more functions described as being performed by another set of elements of the linear TMR sensor system 200.

Figure 3:
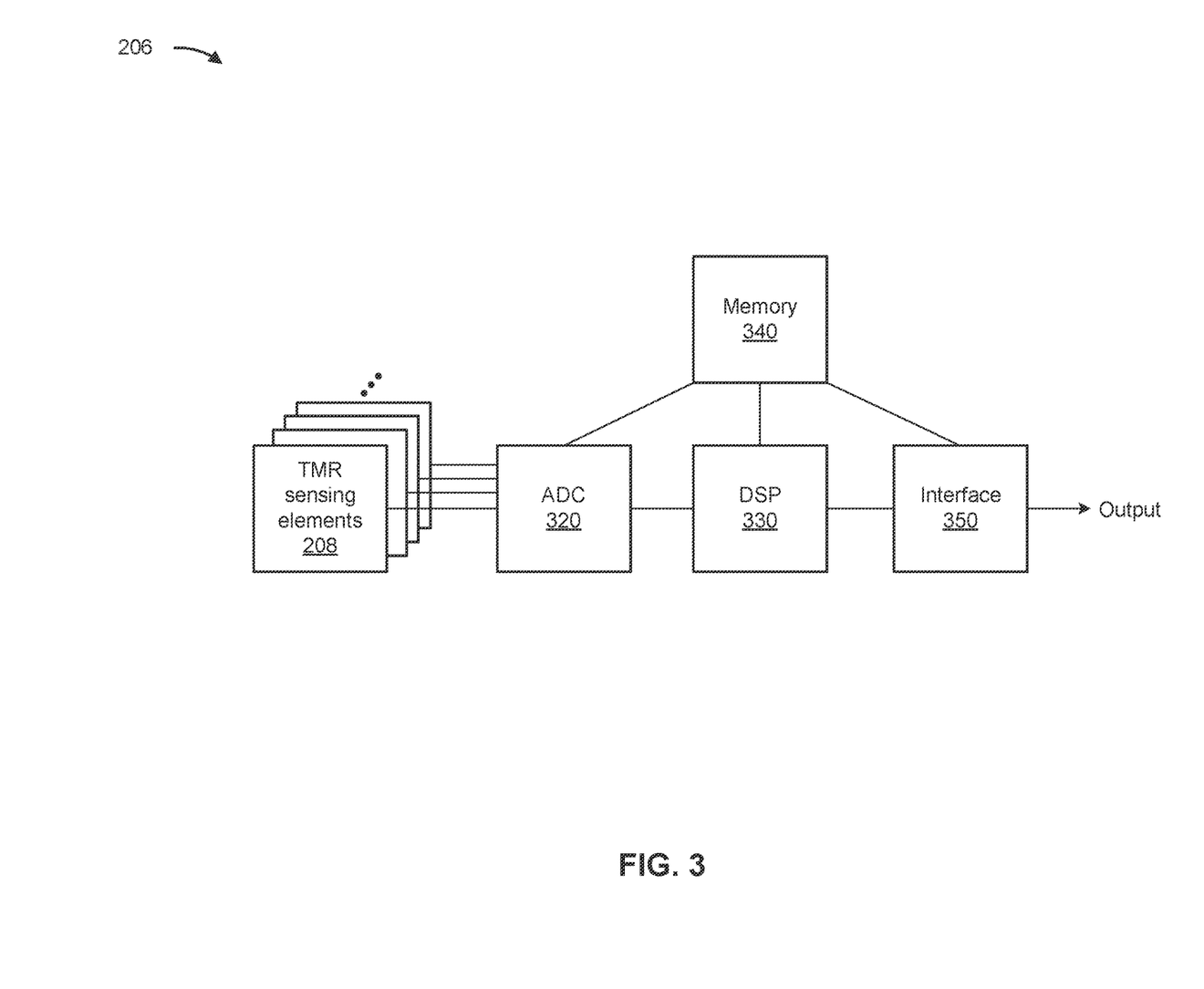
FIG. 3 is a diagram of example elements of sensor chip in in a sensor module of the linear TMR sensor system including an integrated back-bias magnet.

FIG. 3 is a diagram of example elements of sensor chip 206 in in the sensor module 202. As shown in FIG. 3, sensor chip 206 may include a set of TMR sensing elements 208, an analog-to-digital convertor (ADC) 320, a digital signal processor (DSP) 330, a memory element 340, and an interface 350.

TMR sensing element 208 may include an element for sensing a characteristic of a component of a magnetic field based on the TMR effect. For example, the TMR sensing element 208 may include a TMR-based element for sensing a characteristic (e.g., a strength, a direction, a vector, or the like) of a magnetic field (e.g., a magnetic field generated by the back-bias magnet 204) present at the sensor chip 206. In some implementations, a TMR sensing element 208 may comprise a magnetoresistive material (e.g., nickel-iron (NiFe), cobalt iron boron (CoFeB), or the like), where the electrical resistance of the magnetoresistive material may depend on the characteristic (e.g., a strength, a direction, a vector, or the like) of a particular component of the magnetic field present at the magnetoresistive material. In some implementations, the sensor chip 206 may include one or more TMR sensing elements 208 that are sensitive in a first (in-plane) direction and one or more TMR sensing elements 208 that are sensitive in a second (in-plane) direction, as described above with respect to FIG. 2. In some implementations, the set of TMR sensing elements 208 form a 2D linear TMR sensor on the sensor chip 206. In such an implementation, the linear TMR sensor system 200 has a capability to provide a position measurement at power-on with improved accuracy (e.g., as compared to the prior art linear sensor system 150, due to the use of the TMR sensing elements 208).

ADC 320 may include an analog-to-digital converter that converts an analog signal from the set of TMR sensing elements 208 to a digital signal. For example, ADC 320 may convert analog signals, received from the set of TMR sensing elements 208, into digital signals to be processed by DSP 330. ADC 320 may provide the digital signals to DSP 330. In some implementations, sensor chip 206 may include one or more ADCs 320.

DSP 330 may include a digital signal processing device or a collection of digital signal processing devices. In some implementations, DSP 330 may receive digital signals from ADC 320 and may process the digital signals to form a sensor signal (e.g., destined for a control device), such as a sensor signal that conveys a linear position of the ferromagnetic object 212, as described elsewhere herein.

Memory element 340 may include a read only memory (ROM) (e.g., an EEPROM), a random access memory (RANI), and/or another type of dynamic or static storage device (e.g., a flash memory, a magnetic memory, an optical memory, etc.) that stores information and/or instructions for use by sensor chip 206. In some implementations, memory element 340 may store information associated with processing performed by DSP 330. Additionally, or alternatively, memory element 340 may store configurational values or parameters for the set of TMR sensing elements 208 and/or information for one or more other elements of sensor chip 206, such as ADC 320 or interface 350.

Interface 350 may include an interface via which sensor chip 206 may receive and/or provide information from and/or to another device in a system, such as a control device. For example, interface 350 may provide the sensor signal, determined by DSP 330, to the control device and may further receive information from the control device.

The number and arrangement of elements shown in FIG. 3 are provided as one or more examples. In practice, there may be additional elements, fewer elements, different elements, or differently arranged elements than those shown in FIG. 3. Furthermore, two or more elements shown in FIG. 3 may be implemented within a single element, or a single element shown in FIG. 3 may be implemented as multiple, distributed elements. Additionally, or alternatively, a set of elements (e.g., one or more elements) of sensor chip 206 may perform one or more functions described as being performed by another set of elements of sensor chip 206.

Figure 4:
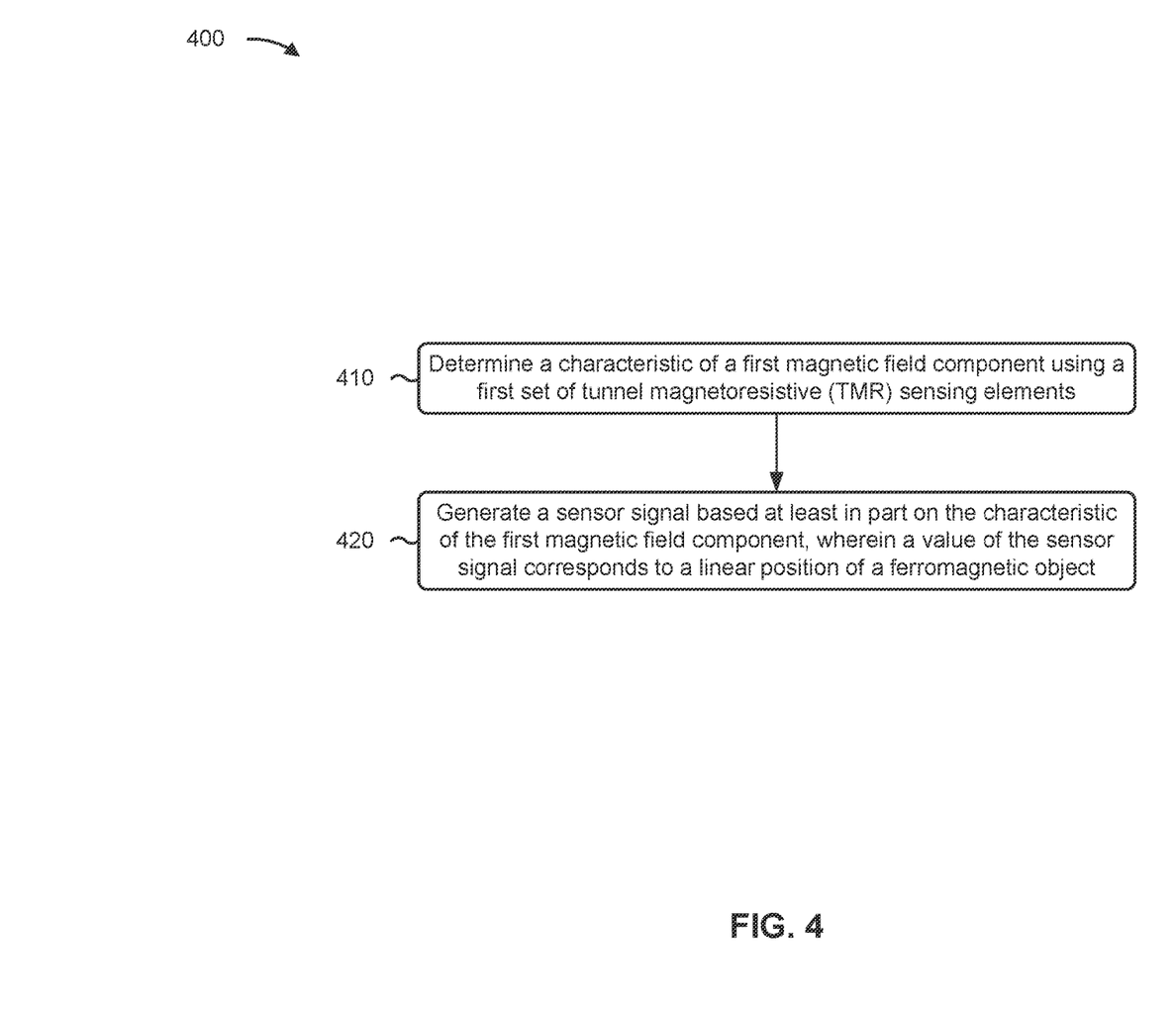
FIG. 4 is a flowchart of an example process associated with operation of a linear TMR sensor including an integrated back-bias magnet.

FIG. 4 is a flowchart of an example process 400 associated with operation of a linear TMR sensor including an integrated back-bias magnet. In some implementations, one or more process blocks of FIG. 4 are performed by a sensor chip (e.g., sensor chip 206). In some implementations, one or more process blocks of FIG. 4 may be performed by one or more components of the sensor chip, such as one or more sensing elements (e.g., one or more TMR sensing elements 208), an ADC (e.g., ADC 320), a DSP (e.g., a DSP 330), a memory (e.g., a memory element 340), and/or an interface (e.g., an interface 350).

As shown in FIG. 4, process 400 may include determining a characteristic of a first magnetic field component using a first set of TMR sensing elements (block 410). For example, the sensor chip may determine a characteristic of a first magnetic field component using a first set of TMR sensing elements, as described above.

As further shown in FIG. 4, process 400 may include generating a sensor signal based at least in part on the characteristic of the first magnetic field component, wherein a value of the sensor signal corresponds to a linear position of a ferromagnetic object (block 420). For example, the sensor chip may generate a sensor signal based at least in part on the characteristic of the first magnetic field component, wherein a value of the sensor signal corresponds to a linear position of a ferromagnetic object, as described above.

Process 400 may include additional implementations, such as any single implementation or any combination of implementations described below and/or in connection with one or more other processes described elsewhere herein.

In a first implementation, the first set of TMR sensing elements is sensitive in a direction that is parallel to a direction of magnetization of a back-bias magnet.

In a second implementation, alone or in combination with the first implementation, the first set of TMR sensing elements is sensitive in a direction that is perpendicular to a direction of magnetization of a back-bias magnet.

In a third implementation, alone or in combination with one or more of the first and second implementations, the first set of TMR sensing elements includes at least two TMR sensing elements that provide differential sensing of the characteristic of the first magnetic field component.

In a fourth implementation, alone or in combination with one or more of the first through third implementations, the first set of TMR sensing elements is sensitive in a direction that is parallel to a direction of magnetization of a back-bias magnet, and process 400 comprises determining a characteristic of a second magnetic field component using a second set of TMR sensing elements, the second set of TMR sensing elements being sensitive in a direction that is perpendicular to the direction of magnetization, and generating the sensor signal further based at least in part on the characteristic of the second magnetic field component.

In a fifth implementation, alone or in combination with one or more of the first through fourth implementations, the first set of TMR sensing elements includes at least two TMR sensing elements that provide differential sensing of the characteristic of the first magnetic field component and the second set of TMR sensing elements includes at least two TMR sensing elements that provide differential sensing of the characteristic of the second magnetic field component.

In a sixth implementation, alone or in combination with one or more of the first through fifth implementations, the sensor chip comprises a mono-cell sensor.

Although FIG. 4 shows example blocks of process 400, in some implementations, process 400 includes additional blocks, fewer blocks, different blocks, or differently arranged blocks than those depicted in FIG. 4. Additionally, or alternatively, two or more of the blocks of process 400 may be performed in parallel.

The foregoing disclosure provides illustration and description, but is not intended to be exhaustive or to limit the implementations to the precise forms disclosed. Modifications and variations may be made in light of the above disclosure or may be acquired from practice of the implementations.

As used herein, the term "component" is intended to be broadly construed as hardware, firmware, and/or a combination of hardware and software. It will be apparent that systems and/or methods described herein may be implemented in different forms of hardware, firmware, or a combination of hardware and software. The actual specialized control hardware or software code used to implement these systems and/or methods is not limiting of the implementations. Thus, the operation and behavior of the systems and/or methods are described herein without reference to specific software code—it being understood that software and hardware can be designed to implement the systems and/or methods based on the description herein.

As used herein, satisfying a threshold may, depending on the context, refer to a value being greater than the threshold, greater than or equal to the threshold, less than the threshold, less than or equal to the threshold, equal to the threshold, not equal to the threshold, or the like.

Even though particular combinations of features are recited in the claims and/or disclosed in the specification, these combinations are not intended to limit the disclosure of various implementations. In fact, many of these features may be combined in ways not specifically recited in the claims and/or disclosed in the specification. Although each dependent claim listed below may directly depend on only one claim, the disclosure of various implementations includes each dependent claim in combination with every other claim in the claim set. As used herein, a phrase referring to "at least one of" a list of items refers to any combination of those items, including single members. As an example, "at least one of: a, b, or c" is intended to cover a, b, c, a-b, a-c, b-c, and a-b-c, as well as any combination with multiple of the same item.

No element, act, or instruction used herein should be construed as critical or essential unless explicitly described as such. Also, as used herein, the articles "a" and "an" are intended to include one or more items, and may be used interchangeably with "one or more." Further, as used herein, the article "the" is intended to include one or more items referenced in connection with the article "the" and may be used interchangeably with "the one or more." Furthermore, as used herein, the term "set" is intended to include one or more items (e.g., related items, unrelated items, or a combination of related and unrelated items,), and may be used interchangeably with "one or more." Where only one item is intended, the phrase "only one" or similar language is used. Also, as used herein, the terms "has," "have," "having," or the like are intended to be open-ended terms. Further, the phrase "based on" is intended to mean "based, at least in part, on" unless explicitly stated otherwise. Also, as used herein, the term "or" is intended to be inclusive when used in a series and may be used interchangeably with "and/or," unless explicitly stated otherwise (e.g., if used in combination with "either" or "only one of"). Further, spatially relative terms, such as "below," "lower," "above," "upper," and the like, may be used herein for ease of description to describe one element or feature's relationship to another element(s) or feature(s) as illustrated in the figures. The spatially relative terms are intended to encompass different orientations of the apparatus, device, and/or element in use or operation in addition to the orientation depicted in the figures. The apparatus may be otherwise oriented (rotated 90 degrees or at other orientations) and the spatially relative descriptors used herein may likewise be interpreted accordingly.

What is claimed is:

1. A sensor module, comprising:
    a back-bias magnet with a magnetization in a first direction and configured to produce a magnetic field based on the magnetization, wherein the back-bias magnet has a magnet surface;
    a sensor chip having a chip surface mounted to the magnet surface, wherein the chip surface defines a chip plane having a first dimension parallel to the first direction and a second dimension parallel to a second direction that is perpendicular to the first direction,
        wherein the sensor chip includes a first set of tunnel magnetoresistive (TMR) sensing elements that are sensitive to an in-plane component of the magnetic field that is parallel to the first direction or parallel to the second direction, and
        wherein the sensor chip is configured to:
            determine a characteristic of a first magnetic field component of the magnetic field using the first set of TMR sensing elements; and
            generate a sensor signal based, at least in part, on the characteristic of the first magnetic field component, wherein a value of the sensor signal corresponds to a linear position of a ferromagnetic object along the second direction, wherein the linear position of the ferromagnetic object is configured to change along the second direction relative to the sensor module.

2. The sensor module of claim 1, wherein the first set of TMR sensing elements are sensitive in the first direction.

3. The sensor module of claim 1, wherein the first set of TMR sensing elements are sensitive in the second direction.

4. The sensor module of claim 1, wherein the first set of TMR sensing elements includes at least two TMR sensing elements that provide differential sensing of the characteristic of the first magnetic field component.

5. The sensor module of claim 1, wherein the first set of TMR sensing elements is sensitive in the first direction, and the sensor chip includes a second set of TMR sensing elements that are sensitive in the second direction, and the sensor chip is further configured to:
   determine a characteristic of a second magnetic field component of the magnetic field along the second direction using the second set of TMR sensing elements; and
   generate the sensor signal further based, at least in part, on the characteristic of the second magnetic field component.

6. The sensor module of claim 5, wherein the first set of TMR sensing elements includes at least two TMR sensing elements that provide differential sensing of the characteristic of the first magnetic field component, and the second set of TMR sensing elements includes at least two TMR sensing elements that provide differential sensing of the characteristic of the second magnetic field component.

7. The sensor module of claim 1, wherein the sensor chip comprises a mono-cell sensor.

8. The sensor module of claim 1, wherein the back-bias magnet includes a first pole and second pole stacked along the first direction.

9. The sensor module of claim 8, further comprising:
   one or more straight leads coupled to the sensor chip and extending parallel to the first direction.

10. The sensor module of claim 1, wherein the chip surface is aligned substantially along a module axis of symmetry of the sensor module.

11. The sensor module of claim 1, wherein the back-bias magnet is arranged symmetrically with respect the first set of TMR sensing elements such that the characteristic of the first magnetic field component is substantially the same at each TMR sensing element of the first set of TMR sensing elements.

12. A method, comprising:
    determining, by a sensor chip, a characteristic of a first magnetic field component of a magnetic field using a first set of tunnel magnetoresistive (TMR) sensing elements; and
    generating, by the sensor chip, a sensor signal based at least in part on the characteristic of the first magnetic field component, wherein a value of the sensor signal corresponds to a linear position of a ferromagnetic object along a second direction,
    wherein the first set of TMR sensing elements is sensitive in a first direction that is parallel to a direction of magnetization of a back-bias magnet, and
    wherein the sensor chip has a chip surface mounted to a magnet surface of the magnet, wherein the chip surface defines a chip plane having a first dimension parallel to the first direction and a second dimension parallel to the second direction that is perpendicular to the first direction.

13. The method of claim 12, wherein the first set of TMR sensing elements includes at least two TMR sensing elements that provide differential sensing of the characteristic of the first magnetic field component.

14. The method of claim 12, wherein the method comprises:
    determining a characteristic of a second magnetic field component using a second set of TMR sensing elements, the second set of TMR sensing elements being sensitive in the second direction; and
    generating the sensor signal further based at least in part on the characteristic of the second magnetic field component.

15. The method of claim 14, wherein the first set of TMR sensing elements includes at least two TMR sensing elements that provide differential sensing of the characteristic of the first magnetic field component and the second set of TMR sensing elements includes at least two TMR sensing elements that provide differential sensing of the characteristic of the second magnetic field component.

16. The method of claim 12, wherein the sensor chip is a mono-cell sensor.

17. The method of claim 12, wherein the back-bias magnet includes a first pole and second pole stacked along the first direction.

18. The method of claim 17, wherein one or more straight leads are coupled to the sensor chip and extend parallel to the first direction.

19. The method of claim 12, wherein the chip surface is aligned substantially along a module axis of symmetry of a sensor module that includes the sensor chip and the back-bias magnet.

20. The method of claim 12, wherein the back-bias magnet is arranged symmetrically with respect the first set of TMR sensing elements such that the characteristic of the first magnetic field component is substantially the same at each TMR sensing element of the first set of TMR sensing elements.

* * * * *